United States Patent [19]
Ingrey et al.

[11] 4,030,967
[45] June 21, 1977

[54] GASEOUS PLASMA ETCHING OF ALUMINUM AND ALUMINUM OXIDE

[75] Inventors: Sidney Ivor Joseph Ingrey, Alymer; Heinz Josef Nentwich; Robert Gordon Poulsen, both of Ottawa, all of Canada

[73] Assignee: Northern Telecom Limited, Montreal, Canada

[22] Filed: Aug. 16, 1976

[21] Appl. No.: 714,631

[52] U.S. Cl. .............................. 156/643; 156/345; 156/646; 156/652; 156/665; 156/667; 204/192 E; 252/79.1
[51] Int. Cl.$^2$ .......................................... C23F 1/02
[58] Field of Search ............. 156/8, 11, 17, 18, 22, 156/345, 643, 646, 652, 653, 656, 659, 665, 667; 252/79.1; 204/192 E

[56] References Cited
UNITED STATES PATENTS

| 3,436,327 | 4/1969 | Shockley | 204/192 |
| 3,615,956 | 10/1971 | Irving et al. | 156/17 |
| 3,975,252 | 8/1976 | Fraser et al. | 204/192 |
| 3,985,597 | 10/1976 | Zielinski | 156/11 |

Primary Examiner—William A. Powell
Attorney, Agent, or Firm—Sidney T. Jelly

[57] ABSTRACT

Gaseous plasma etching of aluminum with conventional plasma etch gases has not hitherto been commercially possible due to a layer of aluminum oxide ($Al_2O_3$) which forms on freshly prepared aluminum surfaces. By first plasma etching in the presence of a gaseous trihalide, preferably in a so-called "pancake" or radial-flow type reactor, the oxide layer is removed. Aluminum etching can then continue, either with or without plasma conditions, depending upon the etch gas used.

8 Claims, 2 Drawing Figures

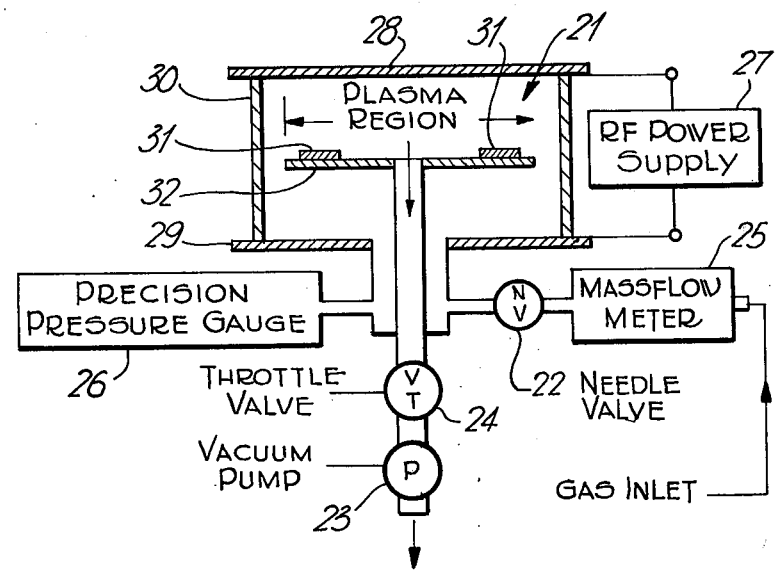
*Fig-2-*
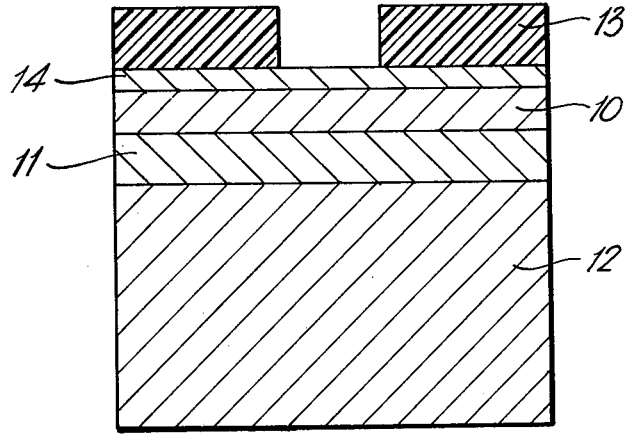
*Fig-1-*

GASEOUS PLASMA ETCHING OF ALUMINUM AND ALUMINUM OXIDE

The invention herein described was made in the course of or under a contract or subcontract thereunder with the Department of the Army.

This invention relates to the gaseous plasma etching of aluminum and aluminum oxide and particularly to the etching through a photoresist mask, as in the production of semiconductor devices.

Gaseous plasma etching is preferred to wet chemical processes for several reasons, such as being cleaner, process simplification with improved resolution capability, the elimination of noxious and polluting acids and solvents, and more economic.

However, it has not been found commercially possible to etch aluminum with conventional plasma etch gases due to aluminum oxide ($Al_2O_3$) which forms on freshly prepared aluminum exposed to atmospheric conditions. This oxide protects the underlying aluminum for etching by the conventional gases. The present invention provides for the gaseous etching of aluminum by first plasma etching in the presence of a gaseous trihalide, preferably in a so-called "pancake" or radial-flow reactor to remove the oxide layer. Aluminum etching can then be continued, either with or without plasma conditions depending upon the etch gas used.

The invention will be readily understood by the following description of various processes and a typical apparatus in conjunction with the accompanying drawings, in which:

FIG. 1 is a cross-section through one particular structure of a semiconductor device;

FIG. 2 is a diagrammatic illustration of one form of apparatus, with the reactor illustrated in cross-section.

In plasma etching, etchant gas molecules are broken up in an RF plasma into chemically active radicals that react with the workpiece, etching occurs and, if the reaction products are volatile, the reaction will continue until one or other of the reactants is completely removed. Typical reactor temperatures are $20° < T < 130°$ C and etching occurs at reasonable rates if the vapor pressure of the reaction product is $\simeq 0.1$ Torr. $AlBr_3$ and $AlCl_3$ have vapor pressures of $\sim 1$ Torr at $100°$ C so that from a vapor pressure viewpoint Al is expected to be etchable in Chlorine and Bromine based etchgases. However it has been found that Al does not etch, even at temperatures up to $300°$ C in $Cl_2$, or HCl. This is now understood to be due to the protective action of a thin layer of $Al_2O_3$. This layer does not etch in $Cl_2$ or HCl due to the inability of these etchgases to reduce the $Al_2O_3$.

A typical structure to be etched in semiconductor device fabrication is illustrated in FIG. 1. An aluminum layer, 10, (typically 0.2 to 1.0 μm thick) covers a layer of $SiO_2$ or $Si_3N_4$, 11, over a silicon wafer substrate 12. The pattern to be etched is defined in the photoresist layer 13, such that only regions unmasked by the photoresist will be etched. It is required that etching proceed to the interface between layers 10 and 11 without unduly ($\lesssim 0.1$ μm) etching under the photoresist mask edge. Etching of layer 11 must be minimal, and ideally this layer should serve as an etchstop so that the aluminum layer, 10 can be etched until all exposed areas are etched away without significant etching of layers 11. A key feature of plasma etching process for Al is the removal of aluminum oxide from its surface at the beginning of the etchcycle, the thin aluminum oxide layer being shown at 14 in FIG. 1.

The etching process uses a pancake style reactor, illustrated in FIG. 2. A suitable etchgas is introduced into the reaction chamber 21 through needle valve 22 and maintained at pressure P by a mechanical vacuum pump 23 which evacuates the reaction chamber 21 through the throttle valve 24. The flow-rate is set by adjustment of the needle valve 22 and monitored with the mass flowmeter 25, while the pressure is set by adjustment of the throttle valve 24 and monitored with the pressure gauage 26. Flowrates of 5 to 500 cc/min and pressures of 0.25 to 1.0 Torr are typical. A plasma is generated in the reactor by applying RF power from the power supply 27 to the electrodes 28 and 29 that are separated by the cylindrical quartz reactor wall 30. Power levels of 10 to 500 watts are typical. An impedance matching network in the power supply 27 is used to optimize power insertion into the reactor. Workpieces 31 rest on the support electrode 32 which is temperature controlled via an electric heater and/or recirculating liquid.

Support electrode 32 and electrode 29 are electrically connected and are usually both at ground potential. The etchgas flows radially through the plasma region, the flow pattern being cylindrically symmetric. Apparatus similar to this has previously been used for plasma deposition of $Si_3N_4$ by Reinberg (U.S. Pat. No. 3,757,733, 1973). For plasma etching the platform 32 is maintained at a preset temperature (typically $50°$ to $130°$ C), the wafers or workpieces 31 are loaded onto this platform, the electrode 28 is replaced, the reactor is evacuated with an argon flush cycle, the etchgas in introduced and etching begins when the RF power is applied. Completion of the etchcycle can be monitored visually.

Electrodes should be made of a conductor relatively inert to the plasma. Stainless steel can be used but there is a slight etching of the electrodes and some contamination from relatively low pressure nickel, iron, chromium and potassium chlorides on the workpiece during etching. While this contamination may be acceptable for some purposes, in semiconductor devices, particularly MOS devices, such contamination can effectively ruin the workpieces. The contamination can be eliminated by using carbon electrodes. An alternative material for the electrodes is silicon carbide.

In the pancake type reactor the RF field, plasma, and etchgas flow vary radially, as does the number of available etchant species, and the etchrate. It is well known that etchrate uniformity is achieved by proper balancing of the electrode spacing, the RF power, and the etchgas flowrate. Further constraints on the plasma parameters are that the RF power should be sufficiently low as not to damage the photoresist through ion bombardment, and that the wafer temperature remains sufficiently low ($\leq 130°$ C) to avoid excessive photoresist erosion and cross-linking during etching.

A suitable etchgas for aluminum etching should form a radical in the plasma to
1. reduce the $Al_2O_3$ protective layer to allow etching of the underlying aluminum
2. form an Aluminum etching radical like Cl in the plasma that yields a volatile reaction product
3. not excessively etch the underlying substrate
4. not excessively erode photoresist etch mask
5. not excessively attack reactor or vacuum pump components 6. not form polymer or other depositions or residues.

These requirements are met by $BCl_3$ or mixtures of $BCl_3$, $Cl_2$, and inert gases. Choice of $BCl_3$ is based on the hypothesis that in the plasma it dissociates into $BCl_2$ and Cl radicals, the $BCl_2$ being a strong reducing agent for $Al_2O_3$ removal perhaps via a volatile oxychloride and Cl being available for Al etching via volatile $AlCl_3$. Uniform etching of 2 $\mu$m Al lines in 6000A thick Al can be regularly achieved at 80° C in ~20 minutes in 0.5 Torr $BCl_3$ at 50 watts in a 12 inch diameter reactor. The $Al_2O_3$ is removed quickly ($\lesssim 2$ minutes) and the Al etchrate is then limited by the available number of aluminum etchant radicals. Introduction of small amounts of $Cl_2$ to the etchgas after 2 mins. of $BCl_3$ etching causes a large decrease in the total time required for Al removal, and in this way very fast etchrates can be obtained.

It is a feature of the present invention that, once the $Al_2O_3$ layer 14 has been removed by plasma etching, the aluminum layer 10 can be etched by chlorine without RF excitation, that is without plasma conditions. It has been found that the etching rate under such conditions is extremely fast. However, dilution of the chlorine with an inert gas such as argon yields controllable etchrates.

Plasma-less etching of the aluminum layer 10 has a potential desirability from a silicon device damage point of view since the plasma is required only for $Al_2O_3$ removal, during which time the device is protected from radiation by the aluminum layer 10. There is little chance of such device damage when the aluminum is etched through in the plasma-less etch sequence. An additional advantage is that a very slight etch damage to the underlying $S_iO_2$ layer 11 which can occur in $BCl_3$ at the higher power inputs is not apparent in the plasma-less etch situation, or when a chlorine and inert gas mixture is used in a plasma etch mode.

Other gases can be used for the plasma etch cycle, for example $BB_{r3}$. Generally, the boron trihalides are applicable for plasma etching to remove the aluminum oxide layer. Chlorine or a mixture of chlorine and an inert gas is added as necessary to provide for etching of the aluminum after removal of the aluminum oxide, under plasma or plasma-less conditions. The boron trihalides flow can be shut off when plasma less etching is carried out in chlorine.

What is claimed is:

1. A process for gaseous etching of aluminum and aluminum oxide, including an initial step of plasma etching in the presence of a gaseous trihalide comprising at least in part, a boron trihalide.

2. A process as claimed in claim 1, including continuing the gaseous plasma etch until any surface layer of aluminum oxide is removed from an underlying layer of aluminum, and further including the step of gaseous plasma etching said aluminum layer.

3. A process as claimed in claim 1, including continuing the gaseous plasma etch until any surface layer of aluminum oxide is removed from an underlying layer of aluminum, and further including the step of gaseous etching said aluminum layer.

4. A process as claimed in claim 3, said step of gaseous etching said aluminum layer using gaseous chlorine.

5. A process as claimed in claim 1, including the addition of gaseous chloride after a predetermined period of etching in the presence of said trihalide.

6. A process as claimed in claim 1, for the production of semiconductor devices on a structure comprising an aluminum layer on an insulating layer over a substrate, including the steps of:
   1. defining a desired pattern to be formed in the aluminum layer by plasma etch resist mask;
   2. plasma etching said structure in the presence of said gaseous trihalide to remove any aluminum oxide layer on said aluminum layer;
   3. gaseous etching said aluminum layer through to said insulating layer.

7. A process as claimed in claim 6, said boron trihalide being $BCl_3$.

8. A process as claimed in claim 6, including the addition of chlorine gas after step (2).

* * * * *